United States Patent
Alpert et al.

(10) Patent No.: US 7,761,832 B2
(45) Date of Patent: Jul. 20, 2010

(54) METHOD FOR INCREMENTAL, TIMING-DRIVEN, PHYSICAL-SYNTHESIS OPTIMIZATION UNDER A LINEAR DELAY MODEL

(75) Inventors: Charles J. Alpert, Cedar Park, TX (US); Zhuo Li, Cedar Park, TX (US); Tao Luo, Austin, TX (US); David A. Papa, Austin, TX (US); Chin Ngai Sze, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 418 days.

(21) Appl. No.: 11/941,418

(22) Filed: Nov. 16, 2007

(65) Prior Publication Data

US 2009/0132970 A1 May 21, 2009

(51) Int. Cl.
*G06F 17/50* (2006.01)
(52) U.S. Cl. .................... 716/10; 716/6; 716/18
(58) Field of Classification Search .............. 716/6, 716/10, 18
See application file for complete search history.

(56) References Cited

U.S. PATENT DOCUMENTS

| | | | | |
|---|---|---|---|---|
| 5,218,551 A * | 6/1993 | Agrawal et al. | | 716/10 |
| 5,751,596 A * | 5/1998 | Ginetti et al. | | 716/6 |
| 6,334,205 B1 * | 12/2001 | Iyer et al. | | 716/7 |
| 6,795,951 B2 * | 9/2004 | Hathaway et al. | | 716/5 |
| 7,020,589 B1 * | 3/2006 | Datta Ray et al. | | 703/2 |
| 7,194,721 B1 * | 3/2007 | Slonim et al. | | 716/16 |
| 7,278,126 B2 * | 10/2007 | Sun et al. | | 716/6 |
| 7,290,233 B2 * | 10/2007 | Curtin et al. | | 716/6 |
| 7,386,822 B1 * | 6/2008 | Hu | | 716/8 |
| 2004/0255257 A1 * | 12/2004 | Ratzlaff | | 716/6 |
| 2005/0066296 A1 * | 3/2005 | Visweswariah | | 716/6 |
| 2006/0010411 A1 * | 1/2006 | Curtin et al. | | 716/6 |
| 2008/0209372 A1 * | 8/2008 | Buck et al. | | 716/6 |
| 2008/0276209 A1 * | 11/2008 | Albrecht et al. | | 716/6 |
| 2009/0013294 A1 * | 1/2009 | Visweswariah | | 716/6 |

* cited by examiner

*Primary Examiner*—Stacy A Whitmore
(74) *Attorney, Agent, or Firm*—Dillon & Yudell LLP

(57) ABSTRACT

A method, data processing system and computer program product for optimizing the placement of logic gates of a subcircuit in a physical synthesis flow. A Pyramids utility identifies and selects movable gate(s) for timing-driven optimization. A delay pyramid and a required arrival time (RAT) surface are generated for each net in the selected subcircuit. A slack pyramid for each net is generated from the difference between the RAT surface and delay pyramid of each net. The slack pyramids are grown and tested using test points to generate a worst-case slack region based on a plurality of slack pyramids in the selected subcircuit. The worst-case slack region is mapped on a placement region and a set of coordinates representing the optimal locations of the movable element(s) in the placement region are determined and outputted.

15 Claims, 4 Drawing Sheets

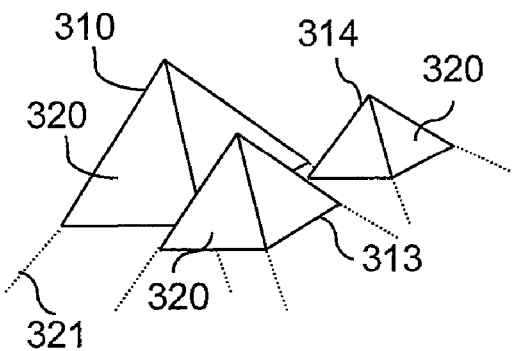
FIG. 3F
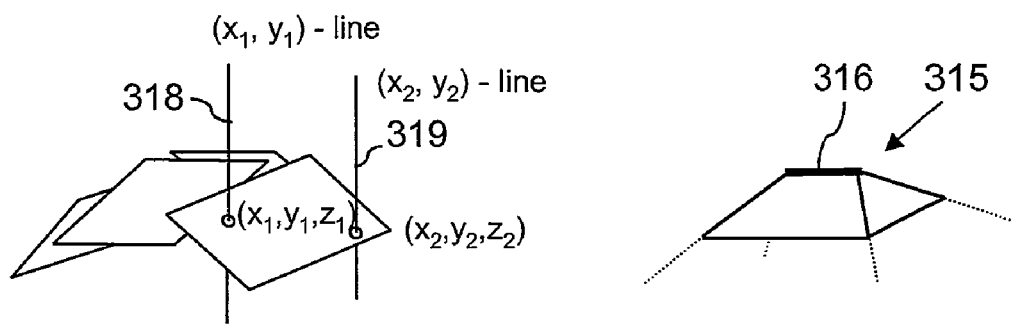
FIG. 3G
FIG. 3H
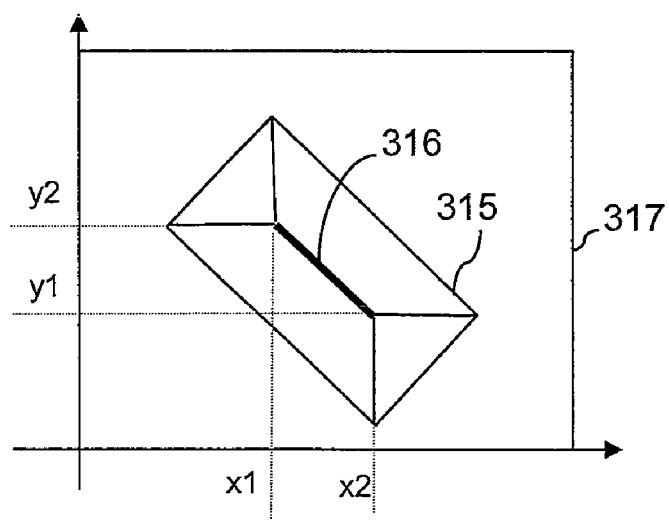
FIG. 3I

US 7,761,832 B2

METHOD FOR INCREMENTAL, TIMING-DRIVEN, PHYSICAL-SYNTHESIS OPTIMIZATION UNDER A LINEAR DELAY MODEL

BACKGROUND OF THE INVENTION

1. Technical Field

The present invention generally relates to integrated circuit design tools and in particular to integrated circuit design tools that optimize area performance and signal integrity in integrated circuits under a linear delay model.

2. Description of the Related Art

Existing methods have sought to improve the placement of negative-slack cells and latches of a circuit in a physical synthesis flow. While several solutions to this problem have existed, there are several drawbacks to these existing solutions. One drawback of existing solutions is that existing solutions consider only the placement of a single, movable gate within an integrated circuit design. Another drawback of existing solutions is that only one optimal placement location is outputted per movable gate.

SUMMARY OF AN EMBODIMENT

Disclosed is a method, system, and computer program product for optimizing the placement of movable gates of a circuit in a physical synthesis flow under a linear delay model. A Pyramid utility is provided, which executes on a processing device/computer to optimize a timing state of an original subcircuit by determining a new optimized placement(s) of movable gate(s). The Pyramids utility: (a) identifies and selects movable gate(s) within a subcircuit corresponding to the movable element(s) based on one or more selection criteria; (b) generates a delay pyramid for each net in a subcircuit; (c) generates a Required Arrival Time (RAT) surface of each net in the subcircuit; (d) generates a slack pyramid of each net in the subcircuit based upon the RAT surface and delay pyramid corresponding to each net; (e) generates a worst-case slack region based upon a plurality of slack pyramids in the subcircuit; (f) maps the worst-case slack region on a placement region; (g) determines the optimal location for the movable element based on the mapping of the worst-case slack region on the placement region; and (h) outputs the optimal location(s) for the movable elements.

The above, as well as additional features of the present invention will become apparent in the following detailed written description.

BRIEF DESCRIPTION OF THE DRAWINGS

The invention itself will best be understood by reference to the following detailed description of an illustrative embodiment when read in conjunction with the accompanying drawings, wherein:

FIGS. 3A-3I represent stages in the execution of the Pyramids utility as applied to an exemplary sequential movable element, according to an illustrative embodiment of the invention.

DETAILED DESCRIPTION OF AN ILLUSTRATIVE EMBODIMENT

The illustrative embodiments provide a method, system, and computer program product for optimizing the placement of logic gates of a subcircuit in a physical synthesis flow, in accordance with one embodiment of the invention. Physical synthesis is the process of creating a specification for a physical integrated circuit (IC) given a logic circuit specification. As utilized herein, a logic gate is an electronic device with several inputs but only one output, which output is be activated by particular combinations of inputs. Moreover, combinations of logic gates are used to store information in sequential logic systems, forming a latch. In order to improve the overall circuit timing of a subcircuit, one or more movable logic gates are placed on a timing-driven basis by directly maximizing a source-to-sink timing arc.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims.

It is understood that the use of specific component, device and/or parameter names are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized.

Figure 1:
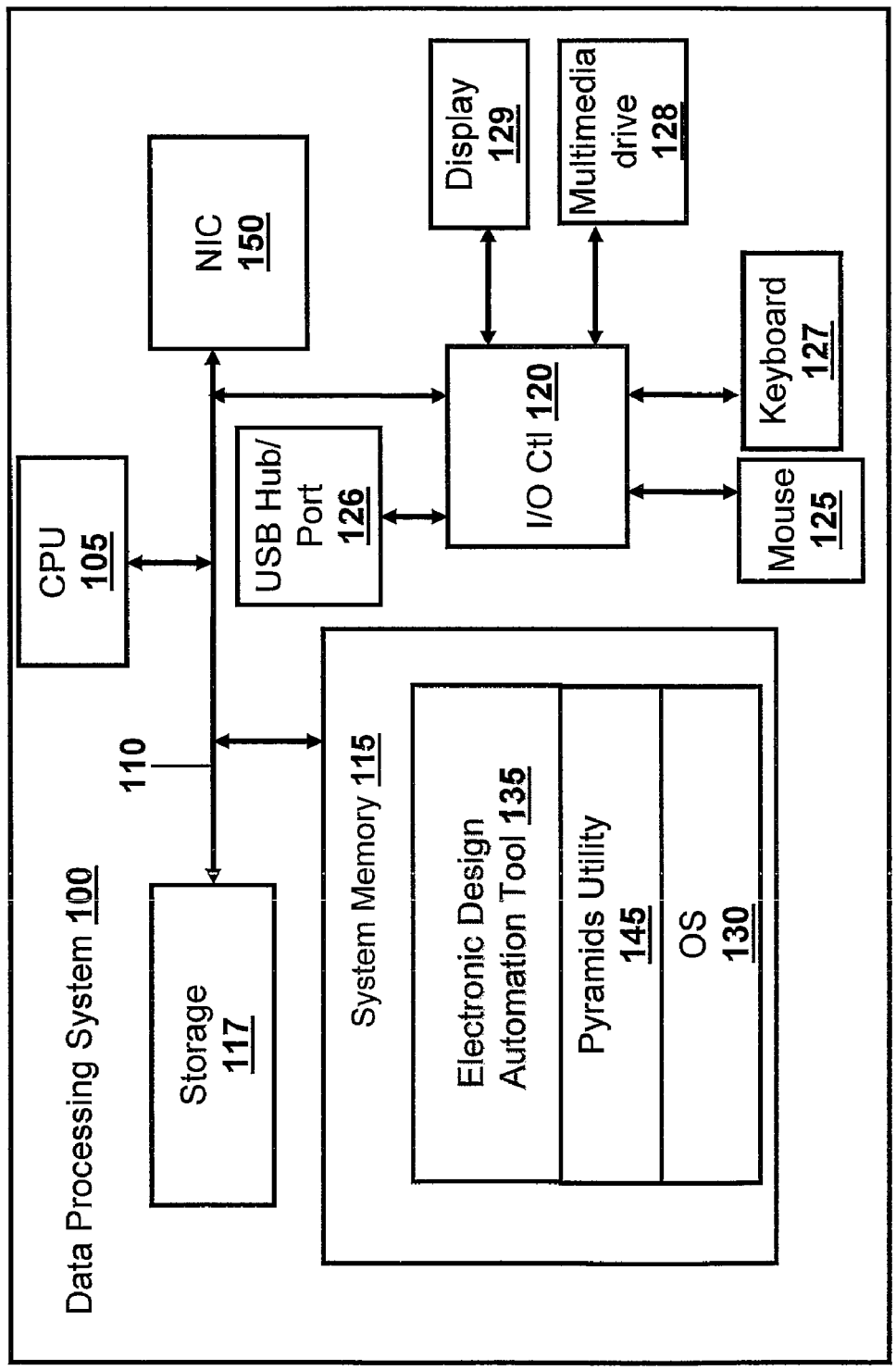
FIG. 1 is a high level block diagram representation of a data processing system, according to one embodiment of the invention.

With reference now to FIG. 1, depicted is a block diagram representation of data processing system (DPS) 100 within which features of the invention are implemented. DPS 100 comprises at least one processor or central processing unit (CPU) 105 connected to system memory 115 via system interconnect/bus 110. Also connected to system bus 110 is I/O controller 120, which provides connectivity and control for input devices, of which pointing device (or mouse) 125 and keyboard 127 are illustrated, and output devices, of which display 129 is illustrated. Additionally, multimedia drive 128 (e.g., CDRW or DVDRW drive) and Universal Serial Bus (USB) hub/port 126 are illustrated, coupled to I/O controller 120. Multimedia drive 128 and USB hub/port 126 may operate as both input and output mechanisms for inserting removable storage devices therein. DPS 100 also comprises storage 117, within which data/instructions/code may be stored. DPS 100 is also illustrated with network interface card (NIC) 150 coupled to system bus 110. NIC 150 enables DPS 100 to connect to one or more access networks, such as the Internet.

Notably, in addition to the above described hardware components of DPS 100, various features of the invention are completed via software (or firmware) code or logic stored within system memory 115 or other storage (e.g., storage 117) and executed by CPU 105. In one embodiment, data/instructions/code from storage 117 populates the system memory 115, which is also coupled to system bus 110. System memory 115 is defined as a lowest level of volatile memory (not shown), including, but not limited to, cache memory, registers, and buffers. Thus, illustrated within system memory 115 are a number of software/firmware components, including operating system (OS) 130 (e.g., Microsoft Windows®, a trademark of Microsoft Corp, GNU®/Linux®, registered trademarks of the Free Software Foundation and Linus Torvalds, or AIX®, a registered trademark of IBM), Electronic Design Automation tool 135, and Pyramids utility 145. In actual implementation, components or code of OS 130 may be combined with those of Pyramids utility 145, collectively providing the various functional features of the invention when the corresponding code is executed by the CPU 105. For simplicity, Electronic Design Automation tool 135 and Pyramids utility 145 are illustrated and described as a stand alone or separate software/firmware component, which is stored in system memory 115 to provide/support the specific novel functions described herein.

CPU 105 executes Electronic Design Automation tool 135, Pyramids utility 145 as well as OS 130, which supports the user interface features of Electronic Design Automation tool 135 and Pyramids utility 145. In the illustrative embodiment, Pyramids utility 145 optimizes a timing state of an original subcircuit by determining a new optimized placement(s) of movable gate(s). Pyramids utility 145 assists by providing the new optimized placement(s) of movable gate(s) to Electronic Design Automation tool 135, which simulates an IC design. In this regard, DPS 100 is being used as an IC design platform for Pyramids utility 145 and Electronic Design Automation tool 135. Electronic Design Automation tool 135 is modified/enhanced with the functionality of Pyramids utility 145.

Among the software code/instructions provided by Pyramids utility 145, and which are specific to the invention, are code for: (a) identifying and selecting at least one movable element and a subcircuit corresponding to the movable element(s) based on one or more selection criteria; (b) generating a delay pyramid for each net in a subcircuit; (c) generating a Required Arrival Time (RAT) surface of each net in the subcircuit; (d) generating a slack pyramid of each net in the subcircuit based upon the RAT surface and delay pyramid corresponding to each net; (e) generating a worst-case slack region based upon a plurality of slack pyramids in the subcircuit; (f) mapping the worst-case slack region on a placement region; (g) determining the optimal location for the movable element; and (h) outputting the optimal location for the movable element. For simplicity of the description, the collective body of code that enables these various features is referred to herein as Pyramids utility 145. According to the illustrative embodiment, when CPU 105 executes Pyramids utility 145, DPS 100 initiates a series of functional processes that enable the above functional features as well as additional features/functionality, which are described below within the description of FIGS. 2 and 3A-3I.

Those of ordinary skill in the art will appreciate that the hardware and basic configuration depicted in FIG. 1 may vary. For example, other devices/components may be used in addition to or in place of the hardware depicted. The depicted example is not meant to imply architectural limitations with respect to the present invention. The data processing system depicted in FIG. 1 may be, for example, an IBM System p5™ (a trademark of International Business Machines—IBM), a product of International Business Machines Corporation in Armonk, N.Y., running the AIX® operating system or LINUX® operating system.

Within the descriptions of the figures, similar elements are provided similar names and reference numerals as those of the previous figure(s). Where a later figure utilizes the element in a different context or with different functionality, the element is provided a different leading numeral representative of the figure number (e.g., 1xx for FIG. 1 and 2xx for FIG. 2). The specific numerals assigned to the elements are provided solely to aid in the description and not meant to imply any limitations (structural or functional) on the invention.

Figure 2:
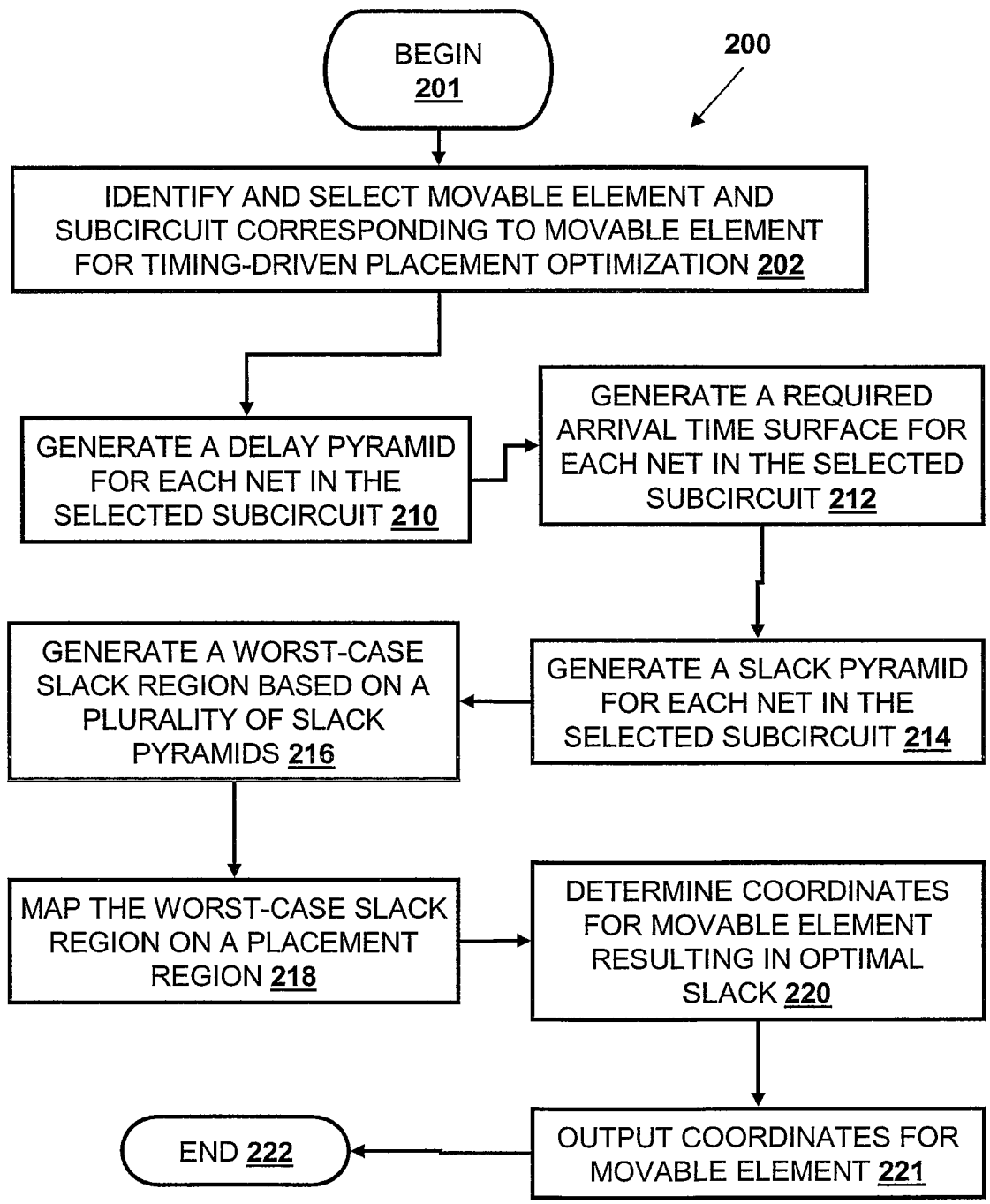
FIG. 2 is a high level logical flowchart of exemplary steps taken to create and utilize the improved method of timing-driven gate placement optimization under a linear delay model, in accordance with one embodiment of the invention.

With reference to FIG. 2, a flow chart illustrating an exemplary method 200 of optimizing the placement of sequential or combination gates of a subcircuit in a physical synthesis flow is shown, according to an illustrative embodiment of the invention. Although the following methods illustrated in FIG. 2 may be described with reference to components shown in FIGS. 1 and 3A-3I, it should be understood that this exemplary method is merely for convenience and alternative components and/or configurations thereof can be employed when implementing the various methods. Key portions of the methods may be completed by Pyramids utility 145 (FIG. 1). Pyramids utility 145 (FIG. 1) executes within DPS 100 (FIG. 1). Moreover, Pyramids utility 145 (FIG. 1) controls specific operations of/on DPS 100 (FIG. 1). Thus, the methods are described from the perspective of either/both Pyramids utility 145 (FIG. 1) and DPS 100 (FIG. 1).

Referring specifically to FIG. 2, the method 200 begins at initiator block 201 and proceeds to block 202, at which the Pyramids utility 145 (FIG. 1) identifies and selects a movable gates(s) for timing-driven placement optimization. In this regard, there are several selection criteria that can be used to identify these movable gate(s). Selection criteria include, but are not limited to, (i) the most critical gate(s) in a circuit, (ii) the most critical paths of a circuit, and (iii) the gate(s) having the largest slack differential between input timing point and output timing point.

As used herein, the following terms are provided/defined:

"timing point" is a vertex in a timing graph; conventionally, all gate pins (input or output) in a circuit have an associated timing point;

"slack" at a timing point is defined as the difference between the required arrival time (RAT) at the timing point and the actual arrival time (AAT) at the timing point. A negative slack value indicates that the signal that is sent to the input of the timing point is actually arriving after its required arrival time. A positive slack value indicates that the signal is arriving before its required arrival time;

"critical gate" is a gate that is characterized as having a negative slack value;

"critical path" is a sequence of connected gates, whereby the combination of each connected gate is characterized as having an overall negative slack value; and "slack differential" is defined as the difference between the smallest slack value of an output timing point and the largest slack value of an input timing point; or vice versa. A large slack differential, especially when either the input timing point or the output timing point has a negative slack value, indicates that the latch timing can likely be improved by moving the movable gate/latch.

Figure 3A:
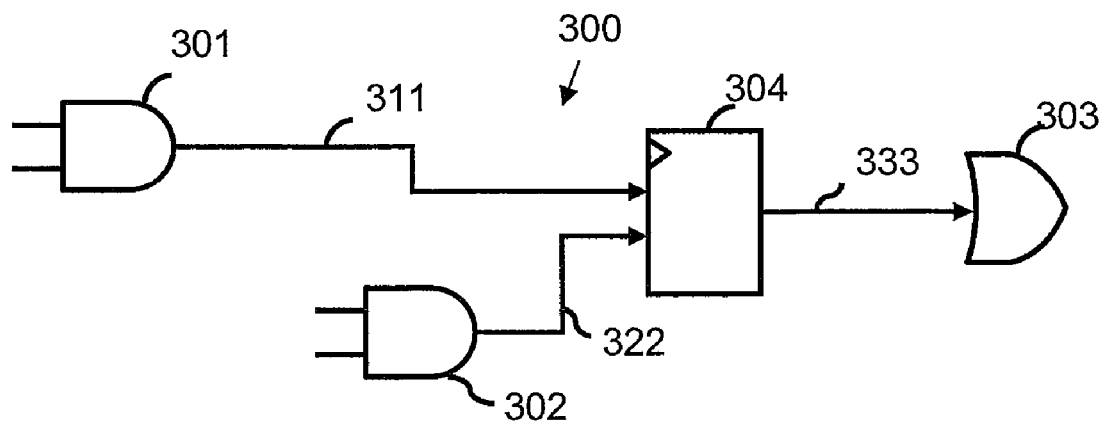
Figure 3B:
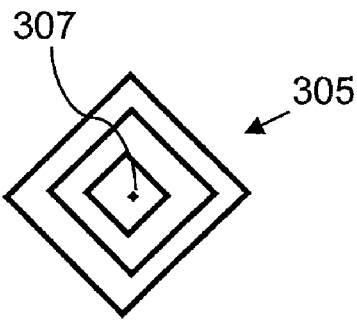
Figure 3C:
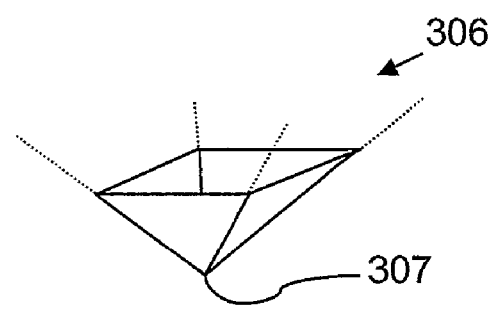
Figure 3D:
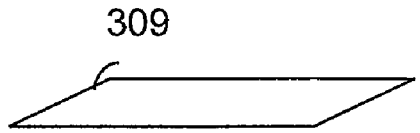
Figure 3E:
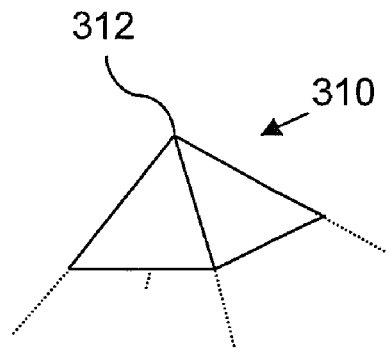

For exemplary purposes only, the movable element is assumed to be a sequential element (e.g., latch 304) of selected subcircuit 300 (shown in FIG. 3A). However, the invention is not limited in this regard and other types of movable elements can be used. For example, method 200 can be used to optimize the placement of combinational gates (e.g., AND-gate, OR-gate, and the like). According to FIG. 3A, subcircuit 300 includes fixed elements (301, 302, and 303), which are connected to latch 304 via nets 311, 322, and 333, respectively. From block 202 (FIG. 2), method 200 continues to block 210 in which a delay pyramid for each net 311, 322, and 333 is generated. An example of a delay pyramid for net 311 is shown in FIGS. 3B and 3C as a delay contour 305 and an isometric representation of delay pyramid 306, respectively. Delay pyramid 306 is representative of the delay that exists in net 311 when movable latch 304 is placed/moved relative to source gate 301. As an example, if latch 304 were placed at the same location of source gate 301, the delay in net 311 would be at a minimum (i.e., illustrated by apex 307 of delay pyramid 306 and delay contour 305).

Continuing with method 200 in FIG. 2, control passes from block 210 to block 212, in which a RAT surface (309 of FIG. 3D) is generated. Moreover, a RAT surface is generated for each net in subcircuit 300. Since there are three nets in this example, a total of three RAT surfaces are generated. It is important to note that because the movable element in this example is a sequential gate, the value of the RAT is a constant value throughout (i.e., represented by a planar surface). In the case of other types of movable elements, such as combinational gates, the RAT value varies depending upon the relative position of the movable element within the subcircuit (i.e., represented as a pyramidal surface). When delay pyramid 306 is subtracted from RAT surface 309, a slack pyramid (310 of FIG. 3E) is generated for net 311, as depicted in block 214 (FIG. 2). In the example shown in FIG. 3E, apex 312 of slack pyramid represents the maximum slack for a given (x, y) coordinate.

Slack pyramids 310, 313, 314 are generated respectively for nets 311, 322, 333 in the selected subcircuit 300, as depicted in FIG. 3F. Each slack pyramid 310, 313, 314 is comprised of four slack planes 320 (the base of each slack pyramid is open and thus does not have a slack plane. As a result, a total of 12 slack planes 320 are generated (4 planes per slack pyramid*3 slack pyramids=12 total slack planes) based on the example shown. In the case of combinational gate movable elements, the resulting shape of a slack pyramid is a basin-like shape (not shown) comprised of 9 slack planes per slack pyramid.

From block 214 of FIG. 2, method 200 continues to block 216 where a worst-case slack region based on a plurality of slack pyramids is generated. The series of steps in generating the worst-case slack region shall now be discussed. After slack pyramids 310, 313, 314 have been generated, slack pyramids 310, 313, 314 are grown by extending slack planes 320 along dashed lines 321 (FIG. 3F). In the example of a sequential movable element illustrated by FIG. 3G, two test points $(x_1, y_1)$ and $(x_2, y_2)$ are then taken and extended along respective $(x_1, y_1)$-line 318 and $(x_2, y_2)$-line 319 (i.e., along the z-axis). It is important to note that the two test points $(x_1, y_1)$ and $(x_2, y_2)$ that are taken should form a test line that is not aligned at a 45-degree angle to either an x-axis or y-axis of a placement region (i.e., the chip surface).

Using the two test points $(x_1, y_1)$ and $(x_2, y_2)$, each slack plane 320 of slack pyramids 310, 313, 314 is subdivided into one of four different directional categories (+x,+y), (+x,−y), (−x,+y), and (−x,−y). By taking two test points $(x_1, y_1)$ and $(x_2, y_2)$ whose respective test lines 318, 319 are not aligned to either the x-axis or y-axis of the placement region, the directional category of each slack plane 320 is determined. As a result, each slack pyramid 310, 313, 314 has one slack plane 320 that is parallel to or of the same directional category as another slack plane 320 that is used to form a different slack pyramid. As used herein, the term "grown" means that slack pyramids 310, 313, 314 of nets 311, 322, 333 are further expanded (as illustrated by dashed lines 321 in FIG. 3F) until one or more of the slack planes of all slack pyramids intersect each other and/or test lines 318, 319 intersect slack planes 320 of the same directional category (i.e., slack planes that are parallel to each other).

In the case of sequential movable elements, by extending the two test points through the grown slack planes, a set of four slack planes of minimum slack (z-value) is determined, as shown in FIG. 3G. By extending lines 318, 319 through the grown slack planes, there are instances in which the $(x_1, y_1)$-line 318 and $(x_2, y_2)$-line 319 will intersect each grown slack plane 320, particularly those slack planes which are parallel to each other. Each intersection point will be at a certain z-coordinate value. After intersecting each grown slack plane 320, the slack plane 320 of the same directional category that is intersected at an intersection coordinate having the lowest z value (i.e., most negative slack value) is taken as one of the four slack planes of minimum slack. When the four slack planes of minimum slack are grown, the resulting shape that is formed from the intersection of these four minimum-slack planes is the worst-case slack region (represented by trough 315). It should be appreciated by persons of ordinary skill in the art that the worst-case slack region may not always be represented by a trough. In the case of combinational movable elements, the worst-case slack region is represented by a basin-type shape (not shown) having nine minimum-slack planes. Moreover, four different test points are instead needed (as compared with only two test points in the case of sequential movable elements) to determine the nine minimum-slack planes required for the optimization of a combinational movable element (i.e., combinational gate).

The worst-case slack region represents the region within the placement region which the movable gate can be placed while accounting for the worst-case slack that can be yielded for one or more of the nets (i.e., source to sink timing arc) of a subcircuit. Within the worst-case slack region (i.e., trough 315 of FIG. 1G), there are different (x, y) coordinate positions that result in better or worse slack values (z-coordinate). For example, when a movable element (i.e., latch 304) is placed at or near the wider base region of trough 315 (FIG. 1G), the movable element will have a less optimal slack than if the movable element were placed along line 316, which represents the optimal location for the placement of the movable element within subcircuit 300. However, it should be appreciated that the optimal location for placement may not always fall along a line, as shown in the above example. Depending on the type of movable and subcircuit that is selected, the optimal location for placement of the movable element within a worst-case slack region can be a point, a line, or a plane.

Referring back to the flowchart in FIG. 2, after generating the worst-case slack region in block 216, the worst-case slack region is mapped to the placement region (i.e., the chip surface generated by Electronic Design Automation tool 135 (FIG. 1)), as depicted in block 218. The mapping step is illustrated in FIG. 3I, which shows a top-view of trough 315, which is placed within the x- and y-coordinates of placement region 317. By mapping the worst-case slack region on the placement region, the optimal (x, y) location of the movable element (i.e., latch 304) is determined, as depicted in block 220. In the example shown in FIG. 3I, the optimal location for the placement of the movable element is any (x, y) coordinate along line 316, which when mapped is located between coordinates $(x_1, y_2)$ and $(x_2, y_1)$. The term optimal location refers to one or more coordinates that are associated with the most favorable slack value (i.e., largest slack value) within the worst-case slack region. After Pyramids utility 145 has determined the optimal location of the movable element, the optimal location(s) (i.e., (x, y) coordinate(s)) is/are outputted via Electronic Design Automation tool 135, as depicted in block 221. From block 221, method 200 ends at termination block 222.

In the flow chart above (FIG. 2), one or more of the methods are embodied as a computer program product in a computer readable medium or containing computer readable code such that a series of steps are performed when the computer readable code is executed on a computing device. In some implementations, certain steps of the methods are combined, performed simultaneously or in a different order, or perhaps omitted, without deviating from the spirit and scope of the invention. Thus, while the method steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

As will be further appreciated, the methods in embodiments of the present invention may be implemented using any combination of software, firmware, or hardware. As a preparatory step to practicing the invention in software, the programming code (whether software or firmware) will typically be stored in one or more machine readable storage mediums such as fixed (hard) drives, diskettes, optical disks, magnetic tape, semiconductor memories such as ROMs, PROMs, etc., thereby making an article of manufacture (or computer program product) in accordance with the invention. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The methods of the invention may be practiced by combining one or more machine-readable storage devices containing the code according to the present invention with appropriate processing hardware to execute the code contained therein. An apparatus for practicing the invention could be one or more processing devices and storage systems containing or having network access to program(s) coded in accordance with the invention.

Thus, it is important that while an illustrative embodiment of the present invention is described in the context of a fully functional computer (server) system with installed (or executed) software, those skilled in the art will appreciate that the software aspects of an illustrative embodiment of the present invention are capable of being distributed as a computer program product in a variety of forms, and that an illustrative embodiment of the present invention applies equally regardless of the particular type of media used to actually carry out the distribution. By way of example, a non exclusive list of types of media includes recordable type (tangible) media such as floppy disks, thumb drives, hard disk drives, CD ROMs, DVD ROMs, and transmission type media such as digital and analog communication links.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. In a computing device, a method for optimizing the timing-driven placement of one or more movable elements of a circuit in a physical synthesis flow, the method comprising:
   identifying and selecting at least one movable element within a subcircuit based on at least one selection criteria;
   generating a delay pyramid for each net in the subcircuit;
   generating a required arrival time (RAT) surface for each net in the subcircuit;
   generating a slack pyramid for each net in the subcircuit;
   generating a worst-case slack region based on a plurality of slack pyramids in the subcircuit;
   mapping the worst-case slack region on a placement region;
   determining a set of coordinates representing an optimal location of the at least one movable element in the placement region based on the mapping of the worst-case slack region; and
   outputting, by said computing device, the determined set of coordinates representing the optimal location of the at least one movable element.

2. The method of claim 1, the method further comprises:
   selecting test points on the placement region; and
   extending the selected test points along an (x, y) line to determine a set of minimum-slack planes from among the slack pyramids generated from each net of the subcircuit;
   wherein the minimum-slack planes are used to generate the worst-case slack region.

3. The method of claim 2, wherein two test points are selected when the movable element is a sequential gate.

4. The method of claim 2, wherein four test points are selected when the movable element is a combinational gate.

5. The method of claim 3, wherein the selected two test points form a test line that is not aligned at a 45-degree angle to an x-axis or y-axis of the placement region.

6. A data processing system comprising:
   a processor;
   a system memory coupled to the processor; and
   a Pyramids utility executing on the processor and having executable code for:
   identifying and selecting at least one movable element within a subcircuit based on at least one selection criteria;
   generating a delay pyramid for each net in the subcircuit;
   generating a required arrival time (RAT) surface for each net in the subcircuit;
   generating a slack pyramid for each net in the subcircuit;
   generating a worst-case slack region based on a plurality of slack pyramids in the sub circuit;
   mapping the worst-case slack region on a placement region;
   determining a set of coordinates representing an optimal location of the at least one movable element in the placement region based on the mapping of the worst-case slack region; and
   outputting the determined set of coordinates representing the optimal location of the at least one movable element.

7. The data processing system of claim 6, the utility further having executable code for:
   selecting test points on the placement region; and
   extending the selected test points along an (x, y) line to determine a set of minimum-slack planes from among the slack pyramids generated from each net of the subcircuit;

wherein the minimum-slack planes are used to generate the worst-case slack region.

8. The data processing system of claim 7, wherein two test points are selected when the movable element is a sequential gate.

9. The data processing system of claim 7, wherein four test points are selected when the movable element is a combinational gate.

10. The data processing system of claim 8, wherein the selected two test points form a test line that is not aligned at a 45-degree angle to an x-axis or y-axis of the placement region.

11. A computer program product comprising:
a computer storage medium; and
program code on the computer storage medium that when executed provides the functions of:
identifying and selecting at least one movable element within a subcircuit based on at least one selection criteria;
generating a delay pyramid for each net in the subcircuit;
generating a required arrival time (RAT) surface for each net in the subcircuit;
generating a slack pyramid for each net in the subcircuit;
generating a worst-case slack region based on a plurality of slack pyramids in the subcircuit;
mapping the worst-case slack region on a placement region;
determining a set of coordinates representing an optimal location of the at least one movable element in the placement region based on the mapping of the worst-case slack region; and
outputting the determined set of coordinates representing the optimal location of the at least one movable element.

12. The computer program product of claim 11, the program code further provides the functions of:
selecting test points on the placement region; and
extending the selected test points along an (x, y) line to determine a set of minimum-slack planes from among the slack pyramids generated from each net of the subcircuit;
wherein the minimum-slack planes are used to generate the worst-case slack region.

13. The computer program product of claim 12, wherein two test points are selected when the movable element is a sequential gate.

14. The computer program product of claim 12, wherein four test points are selected when the movable element is a combinational gate.

15. The computer program product of claim 13, wherein the selected two test points form a test line that is not aligned at a 45-degree angle to an x-axis or y-axis of the placement region.

* * * * *